(12) United States Patent
Jander et al.

(10) Patent No.: US 12,080,995 B2
(45) Date of Patent: Sep. 3, 2024

(54) LASER DIODE CHIP

(71) Applicant: OSRAM OLED GmbH, Regensburg (DE)

(72) Inventors: Peter Jander, Regensburg (DE); Michael Roth, Regensburg (DE); Tomasz Swietlik, Regensburg (DE); Clemens Vierheilig, Tegernheim (DE)

(73) Assignee: OSRAM OLED GMBH, Regensburg (DE)

( * ) Notice: Subject to any disclaimer, the term of this patent is extended or adjusted under 35 U.S.C. 154(b) by 733 days.

(21) Appl. No.: 17/263,786

(22) PCT Filed: Jul. 30, 2019

(86) PCT No.: PCT/EP2019/070523
§ 371 (c)(1),
(2) Date: Jan. 27, 2021

(87) PCT Pub. No.: WO2020/025626
PCT Pub. Date: Feb. 6, 2020

(65) Prior Publication Data
US 2021/0305776 A1    Sep. 30, 2021

(30) Foreign Application Priority Data

Aug. 1, 2018 (DE) .......................... 102018118694.0

(51) Int. Cl.
*H01S 5/06* (2006.01)
*H01S 5/024* (2006.01)
(Continued)

(52) U.S. Cl.
CPC ........ *H01S 5/0612* (2013.01); *H01S 5/02453* (2013.01); *H01S 5/0261* (2013.01); *H01S 5/22* (2013.01); *H01S 5/323* (2013.01)

(58) Field of Classification Search
CPC .. H01S 5/0612; H01S 5/0261; H01S 5/06837; H01S 5/02453; H01S 5/02469
See application file for complete search history.

(56) References Cited

U.S. PATENT DOCUMENTS 4,695,714 A * 9/1987 Kimizuka ........... H01S 5/02453
250/238
5,140,605 A * 8/1992 Paoli ...................... H01S 5/4031
372/50.1
(Continued)

FOREIGN PATENT DOCUMENTS

CN    107408792 A  * 11/2017  ......... H01S 5/02453
DE    19717545 A1     4/1997
(Continued)

OTHER PUBLICATIONS

Zhang et al., "Widely tunable dual-mode distributed feedback laser fabricated by selective area growth technology integrated with Ti heaters", Optics Letters, vol. 38, No. 6, Aug. 15, 2013, 4 pages.
(Continued)

*Primary Examiner* — Joshua King
(74) *Attorney, Agent, or Firm* — MH2 TECHNOLOGY LAW GROUP LLP

(57) ABSTRACT

A laser diode chip is described, comprising including:
an n-type semiconductor region, a p-type semiconductor region, and an active layer arranged between the n-type semiconductor region and the p-type semiconductor region, an n-type contact and a p-type contact,
at least one heating element arranged on a side of the laser diode chip facing the p-type semiconductor region, the heating element functioning as a resistance heater, and
at least one metallic seed layer, wherein the heating element comprises a part of the seed layer, and wherein the p-type contact is arranged on a further part of the seed layer.

14 Claims, 6 Drawing Sheets

(51) Int. Cl.
*H01S 5/026* (2006.01)
*H01S 5/22* (2006.01)
*H01S 5/323* (2006.01)

(56) References Cited

U.S. PATENT DOCUMENTS

| | | | | |
|---|---|---|---|---|
| 5,173,909 | A * | 12/1992 | Sakano | H01S 5/0612 372/20 |
| 5,341,391 | A * | 8/1994 | Ishimura | H01S 5/0612 372/45.01 |
| 5,751,754 | A | 5/1998 | Takagi | |
| 6,700,910 | B1 * | 3/2004 | Aoki | B82Y 20/00 398/43 |
| 9,246,307 | B1 * | 1/2016 | Yan | H01S 5/02453 |
| 2002/0090011 | A1 | 7/2002 | Pezeshki et al. | |
| 2005/0180481 | A1 | 8/2005 | Kaneko et al. | |
| 2006/0045147 | A1 * | 3/2006 | Sin | H01S 5/0612 372/20 |
| 2008/0025355 | A1 | 1/2008 | Hu et al. | |
| 2010/0220755 | A1 * | 9/2010 | Frank | H01S 5/0612 372/45.01 |
| 2011/0096799 | A1 * | 4/2011 | Mori | H01L 33/0045 372/20 |
| 2015/0078411 | A1 | 3/2015 | Bismuto et al. | |
| 2016/0111856 | A1 * | 4/2016 | Yan | H01S 5/3211 372/34 |
| 2018/0205200 | A1 * | 7/2018 | Kwon | G02B 6/12 |

FOREIGN PATENT DOCUMENTS

| | | | | |
|---|---|---|---|---|
| GB | 2408847 A * | 6/2005 | | H01S 5/0261 |
| WO | WO-9838710 A1 * | 9/1998 | | H01S 5/0612 |
| WO | WO-2007038918 A3 * | 6/2008 | | H01S 5/0261 |
| WO | WO-2011013535 A1 * | 2/2011 | | B82Y 20/00 |
| WO | 2017102863 A1 | 6/2017 | | |

OTHER PUBLICATIONS

International Search Report and Written Opinion in corresponding International Application No. PCT/EP2019/070523 mailed on Nov. 4, 2019, 14 pages.

* cited by examiner

LASER DIODE CHIP

FIELD

The invention relates to a laser diode chip characterized in particular by improved stability of the emission wavelength.

CROSS REFERENCE TO RELATED APPLICATIONS

This patent application is a national stage entry from International Application No. PCT/EP2019/070523, filed on Jul. 30, 2019, published as International Publication No. WO 2020/025626 A1 on Feb. 6, 2020, and claims priority under 35 U.S.C. § 119 from German patent application 10 2018 118 694.0, filed Aug. 1, 2018, the entire contents of all of which are hereby incorporated by reference.

BACKGROUND

Laser diode chips typically have a temperature-dependent emission wavelength. Furthermore, a production-related dispersion of the emission wavelength may occur at a given temperature. This can be undesirable especially for metrology applications where, for example, ambient light is to be filtered out by spectrally narrowband filters to increase the signal-to-noise ratio of the measured value. When these narrow-band filters are used, there is a risk that the wavelength of the laser light is outside the transmission window of the filter, at least at certain temperatures, and therefore the light cannot reach the detector. This risk is particularly high if, for example, the laser diode chip cannot be used in a temperature-controlled environment due to the application, or if the laser is to be operated at different powers (and thus different levels of self-heating).

A possible solution is a temperature control of the laser's environment. However, this requires heating a larger mass, which requires high (peak) heating powers, especially if the target wavelength is to be reached in a short time. In addition, it is difficult to keep the temperature stable at the target value for large heated masses, since both the self-heating of the laser during operation and, should the situation arise, rapid changes in the external temperature have to be compensated.

An object to be solved is to specify an improved laser diode chip, which is characterized in particular by improved stability of the emission wavelength.

This object is solved by a laser diode chip according to independent claim 1. Advantageous embodiments and further configurations of the invention are the subject of the dependent claims.

SUMMARY

According to at least one embodiment, the laser diode chip comprises an n-type semiconductor region, a p-type semiconductor region and an active layer arranged between the n-type semiconductor region and the p-type semiconductor region. The n-type semiconductor region, the p-type semiconductor region, and/or the active layer may each comprise one or more semiconductor layers. For example, the laser diode chip comprises a p-contact for electrically contacting the p-type semiconductor region and an n-contact for electrically contacting the n-type semiconductor region. The p-contact and/or the n-contact may comprise, in particular, a metal, a metal alloy, and/or a layer of a transparent conductive oxide.

In particular, the laser diode chip may comprise a III-V semiconductor material. Depending on the emission wavelength, the semiconductor material may be, for example, an arsenide compound semiconductor material, a phosphide compound semiconductor material, or a nitride compound semiconductor material.

According to at least one embodiment, the laser diode chip comprises a heating element preferably arranged on a side of the laser diode chip facing the p-type semiconductor region. In particular, the heating element follows the p-type semiconductor region as viewed from the active layer. For example, the heating element may be arranged directly on the p-type semiconductor region or preferably on an electrically insulating layer arranged on the p-type semiconductor region.

That a layer or element is arranged or applied "on" or "above" the other layer or element may mean here and hereinafter that the layer or element is arranged directly in direct mechanical and/or electrical contact on the other layer or element. Further, it may also mean that the layer or element is arranged indirectly on or above the other layer or element. In this case, further layers and/or elements may then be arranged between the one and the other layer or between the one and the other element.

That a layer or element is arranged "between" two other layers or elements may mean here and in the following that the one layer or element is arranged directly in direct mechanical and/or electrical contact or in indirect contact to one of the two other layers or elements and in direct mechanical and/or electrical contact or in indirect contact to the other of the two other layers or elements. Thereby, in case of indirect contact, further layers and/or elements may then be arranged between the one and at least one of the two other layers or between the one and at least one of the two other elements, respectively.

According to at least one embodiment, the laser diode chip comprises at least one metallic seed layer, wherein the heating element comprises a part of the seed layer, and wherein the p-contact is arranged on a further part of the seed layer. In particular, the heating element is formed at least in regions by the metallic seed layer, the p-contact being deposited in regions on the metallic seed layer. The metallic seed layer can comprise regions which are provided for depositing the p-contact. Advantageously, the heating element in this embodiment is formed by a region of the seed layer, the seed layer being applied to the semiconductor layer sequence of the laser diode chip and patterned in any case to produce the p-contact. The manufacturing effort for producing the heating element is therefore advantageously low. The seed layer may comprise one or more metallic layers, for example a Ti/Pd/Au layer sequence or a Ti/Pt/Au layer sequence.

The heating element is preferably a conductor track that acts as a resistance heater during operation of the laser diode chip. In particular, electrical energy is converted into heat in the heating element and the laser diode chip is heated in this way in a targeted manner. By means of the heating element, the laser diode chip can advantageously be selectively heated to a predetermined temperature at which the laser diode chip comprises a predetermined emission wavelength. In this way, it is advantageously achieved that the laser diode chip comprises a stabilized emission wavelength.

According to at least one embodiment, the laser diode chip is arranged on a heat sink, wherein the active layer is arranged between the heating element and the heat sink. In other words, in this embodiment, the heating element is opposite to the heat sink when viewed from the active layer.

This enables particularly efficient heating of the active layer by the heating element, since the heat paths between the heating element and the heat sink in this case run through active layer and advantageously no parasitic heat paths exist. In this embodiment, in particular, the n-type semiconductor region of the laser diode chip faces the heat sink, for example, the n-type semiconductor region may be connected to the heat sink by means of a connecting layer such as a solder layer. In this case, the heating element is arranged in particular on the side of the laser diode chip facing the ambient medium. The heat sink is advantageously formed from a material with good thermal conductivity, such as copper.

In a preferred configuration, the heating element and the p-contact of the laser diode chip comprise the same material. In this case, the manufacturing effort of the heating element is advantageously low, since no layer of an additional material has to be applied. In particular, the same coating process and/or the same structuring process can be used for manufacturing the heating element as for manufacturing the p-contact. Preferably, the heating element comprises at least one of the metals gold, titanium, platinum and palladium.

According to at least one embodiment, the heating element is not provided for injecting an operating current into the active layer of the laser diode chip. This distinguishes the heating element in particular from the p-contact of the laser diode chip, which may be made of the same material as the heating element.

In a preferred configuration, the heating element is connected to electrical contacts that are not connected to a p-contact or an n-contact of the laser diode chip. In this case, the electrical circuits for the heating element and the laser diode chip are completely separate. The current flow through the heating element can thus be controlled independently of the current flow through the active layer.

In an alternative embodiment, the heating element comprises a common contact with the laser diode chip. The common contact is preferably the p-contact of the laser diode chip. This common contact can be used to independently control the current flow through the laser diode chip and the heating element when the laser diode chip and the heating element are operated simultaneously. To simplify the control, it is also possible to operate the laser diode chip and the heating element only alternately and not simultaneously.

According to at least one embodiment, the heating element is arranged above a p-contact of the laser diode chip, wherein a passivation layer, for example a silicon oxide layer or a silicon nitride layer, is arranged between the heating element and the p-contact.

In a configuration, the laser diode chip comprises a ridge, wherein the heating element is arranged parallel to the ridge. In this way, it is advantageously possible to uniformly heat the optically active region defined by the ridge waveguide. Preferably, the length of the heating element is substantially the same as the length of the ridge waveguide.

In a configuration, the p-type semiconductor region is covered in regions with a passivation layer, with the heating element arranged on the passivation layer.

In this case, the heating element is advantageously separated from the p-type semiconductor region only by the passivation layer, so that the semiconductor material can be effectively heated.

According to at least one embodiment, the heating element is a galvanic layer at least in regions. In this embodiment, the heating element is advantageously produced by electrodeposition. Thus, a process is advantageously used for manufacturing the heating element which is advantageously also used for manufacturing the p-contact of the laser diode chip. This advantageously reduces the manufacturing effort.

According to at least one embodiment, a current path is formed through the p-type semiconductor region between the heating element and the p-contact of the laser diode chip. In this configuration, the heating current can be supplied via a heating contact that is electrically conductively connected to the p-type semiconductor region and flows from there to the p-contact. In this way, an additional current path is generated in the p-type semiconductor region that does not lead to the n-contact. The current flow along this current path heats the semiconductor material so that the p-type semiconductor region acts as a heating element. An advantage of this embodiment is that the semiconductor material itself is directly heated. Preferably, the laser diode chip and the heating element are not operated simultaneously in this embodiment. For example, the laser diode chip and the heating element may be operated alternately.

According to at least one embodiment, the heating element is connected to a control device configured to control the heating power of the heating element. The control device can, in particular, regulate a current flow through the heating element in order to adjust the heating power in this way. In particular, the control device may be configured to regulate the heating power such that the emission wavelength of the laser diode chip is within a predetermined tolerance in a target value range.

The control can be performed, for example, by directing at least a portion of the emitted radiation to an optical filter that comprises a transmission window at the desired emission wavelength. In this case, the heating power of the heating element can be controlled such that a detector element behind the optical filter detects a maximum intensity. When the wavelength of the emitted radiation changes, the heating power can be controlled such that the intensity detected by the detector element is maximized.

BRIEF DESCRIPTION OF THE DRAWINGS

The laser diode chip is explained in more detail below with reference to exemplary embodiments in connection with FIGS. 1 to 8.

In the Figures.

DETAILED DESCRIPTION

Figure 1A:
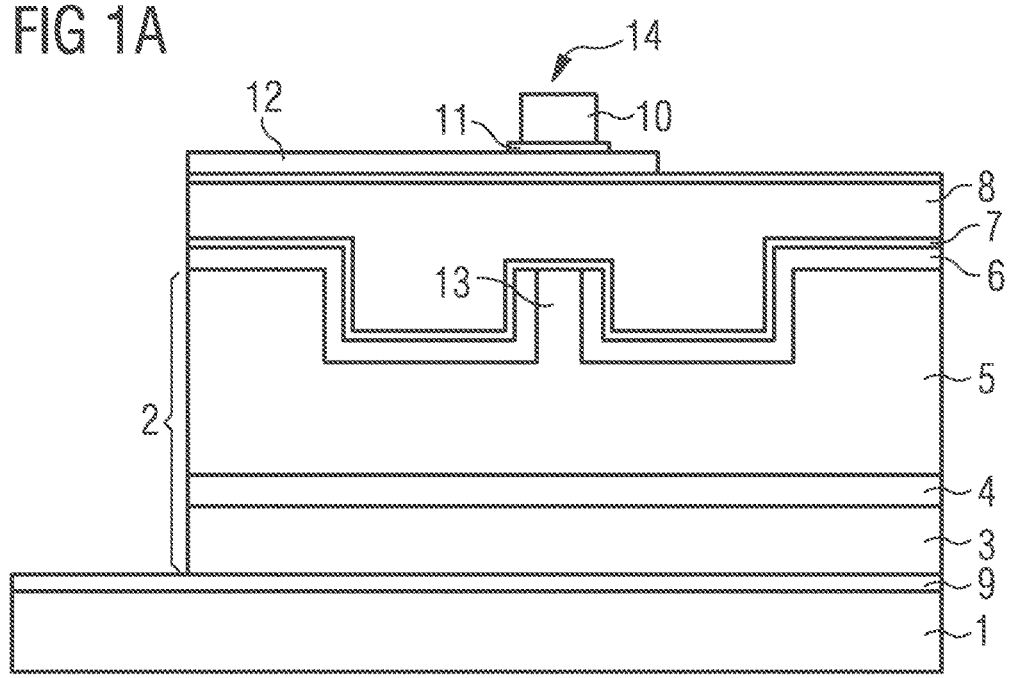
FIG. 1A shows a schematic representation of a cross-section through the laser diode chip according to a first example.
Figure 1B:
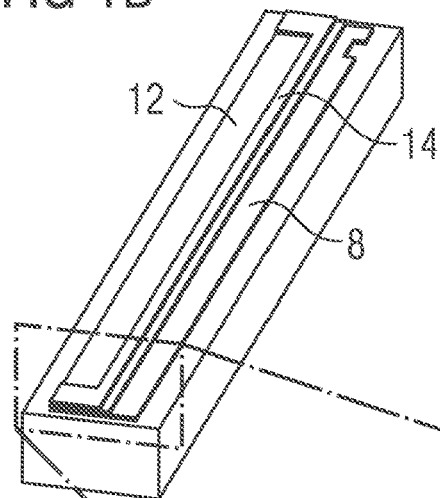
FIG. 1B shows a schematic representation of a perspective view of a laser diode chip according to the first example.
Figure 1C:
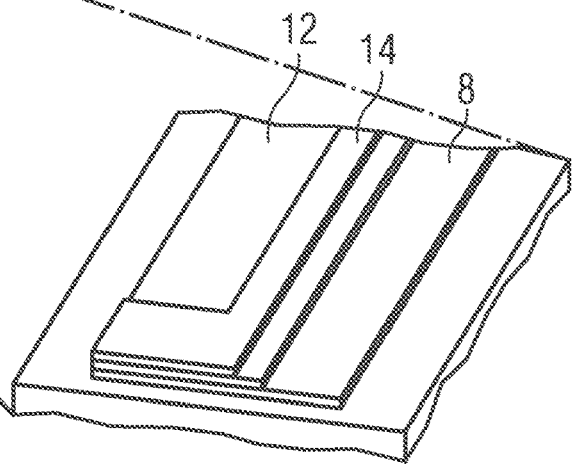
FIG. 1C shows a detailed view of the laser diode chip according to the first example.

In FIGS. 1A, 1B, and 1C, an exemplary embodiment of the laser diode chip is shown in a cross-sectional view, a top view, and a detailed top view, respectively. The laser diode chip comprises a semiconductor layer sequence 2 with an n-type semiconductor region 3, an active layer 4, and a p-type semiconductor region 5.

The active layer 4 may be formed, for example, as a pn junction, a double heterostructure, a single quantum well structure or a multiple quantum well structure. In this context, the term quantum well structure includes any structure in which charge carriers undergo quantization of their energy states by confinement. In particular, the term quantum well structure does not contain any indication of the dimensionality of the quantization. Thus, it includes, but is not limited to, quantum wells, quantum rods, quantum dots, and any combination of these structures.

The semiconductor layer sequence 2 of the laser diode chip is preferably based on a III-V compound semiconductor material, in particular an arsenide, nitride or phosphide compound semiconductor material. For example, the semiconductor layer sequence 2 may include $In_xAl_yGa_{1-x-y}N$, $In_xAl_yGa_{1-x-y}P$ or $In_xAl_yGa_{1-x-y}As$, each with $0 \leq x \leq 1$, $0 \leq y \leq 1$, and $x+y \leq 1$. In this regard, the III-V compound semiconductor material need not necessarily comprise a mathematically exact composition according to any of the above formulas. Rather, it may comprise one or more dopants as well as additional constituents. For the sake of simplicity, however, the above formulas include only the essential constituents of the crystal lattice, even if these may be replaced in part by small amounts of additional substances. The material selection is based on the desired emission wavelengths of the laser diode chip.

A ridge waveguide 13 (ridge) is formed in the p-type semiconductor region 5. The ridge waveguide 13 can be formed by patterning the p-type semiconductor region 5, for example, by a photolithographic method. For electrical contacting, the laser diode chip comprises an n-type contact 9 and a p-type contact 8, which are implemented as metal layers, for example.

The p-contact 8 arranged on the p-type semiconductor region 5 can be a gold layer, for example. In particular, the p-contact 8 may be formed by electrodeposition on a seed layer 7. The thickness of the p-contact may be, for example, between 1 μm and 10 μm, in particular about 5 μm.

The seed layer 7 can be, for example, a titanium-palladium-gold layer sequence. The thickness of the seed layer 7 may be, for example, about 470 nm. In the exemplary embodiment, the p-contact 8 is electrically conductively connected to the p-type semiconductor region 5 only at the upper side of the ridge waveguide 13. Outside the ridge waveguide 13, the p-contact 8 is electrically isolated from the p-type semiconductor region 5 by a passivation layer 6.

The laser diode chip comprises a heating element 14 on a side facing the p-type semiconductor region 5. In the exemplary embodiment shown here, the heating element 14 is formed as a conductor track arranged above the ridge waveguide 13 and the p-type contact 8. In the present case, the heating element 14 is not electrically conductively connected to the p-contact 8, but is insulated from the p-contact 8 by a passivation layer 12. The passivation layer 13 can be, for example, an oxide layer or nitride layer, in particular a silicon oxide layer or silicon nitride layer. Like the p-contact 8, the heating element 14, which is designed as a conductor track, can be produced by electrodeposition of a metal layer 10 on a seed layer 11. The metal layer 10 may be, for example, a gold layer. Since the heating element 14 can be formed from the same material as the p-contact 8 and, in particular, can be produced using the same manufacturing process, the heating element 14 can be realized with comparatively low manufacturing effort.

As can be seen in the top view in FIG. 1B, the heating element 14 can be designed as a conductor track, the length of which preferably essentially corresponding to the length of the ridge waveguide 13. In this way, it can be achieved that the active layer 4 is uniformly heated by the heating element 14. The heating element 14 comprises an ohmic resistance, which in particular results from the length and the cross-sectional area of the heating element 14. The ohmic resistance, and thus the heating power or the current/voltage operating point, can be adjusted by, in particular, the material, the layer thickness, the width and/or the length of the heating element 14. For example, the layer thickness of the heating element 14 can be between 1 μm and 10 μm, in particular about 5 μm. The width of the heating element 14 is preferably between 5 μm and 30 μm.

The heating element 14 can comprise contact pads at its ends for making electrical contact. By energizing the heating element, a heating power is generated by which the semiconductor layer sequence 2 including the active layer 4 can be heated. By adjusting the heating power, the temperature-dependent emission wavelength of the laser diode chip can be influenced in a targeted manner. Here it is advantageous that the heating element 14 is arranged directly above the semiconductor layer sequence 2 of the laser diode chip, in particular therefore not on a carrier or a heat sink 1 of the laser diode chip. In this way, direct thermal contact with the semiconductor layer sequence can be advantageously achieved. The mass to be heated is therefore advantageously small. The heating element 14 described here can therefore be used for fast and effective control of the temperature of the semiconductor layer sequence and of the emission wavelength dependent on the temperature.

The laser diode chip is advantageously connected to a heat sink 1 at the n-contact 9. In this case, the light-emitting active layer 4 is located between the heating element 14 and the heat sink 1. The enables efficient heating of the active layer 4, since no parasitic heat paths exist between the heating element 14 and the heat sink 1.

Figure 2A:
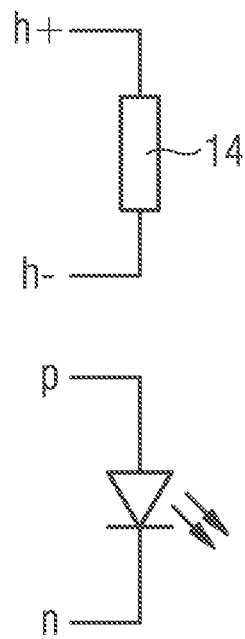
FIGS. 2A and 2B show respectively exemplary representations of the circuits of the heating element and the laser diode chip.
Figure 2B:
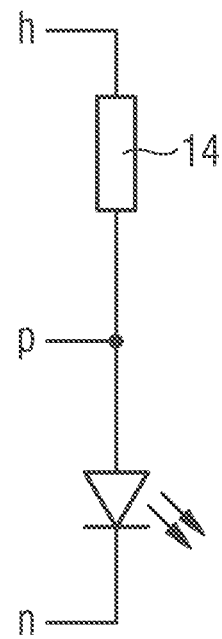

Two variants are basically conceivable for the electrical connection of the heating element 14, which are shown in FIGS. 2A and 2B. FIG. 2A shows a variant in which the circuits for the laser diode chip and the heating element 14 are completely separate. For example, the heating element 14 comprises two contacts h+, h− which are separated from contacts p, n of the laser diode chip. This makes the control of the actuation simple, but requires four electrical contacts with a corresponding effort in contacting. The previously shown exemplary embodiment of FIGS. 1A to 1C shows such a variant.

As shown in FIG. 2B, a contact h of the heating element 14 may alternatively be connected to a contact p of the laser diode chip, preferably the p-contact. This common contact can be used to independently control the current flow through the laser diode chip and the heating element 14 when the laser diode chip and the heating element 14 are operated simultaneously. To simplify the control, it is also conceivable to operate the laser diode chip and the heating element 14 only alternately and not simultaneously.

Figure 3A:
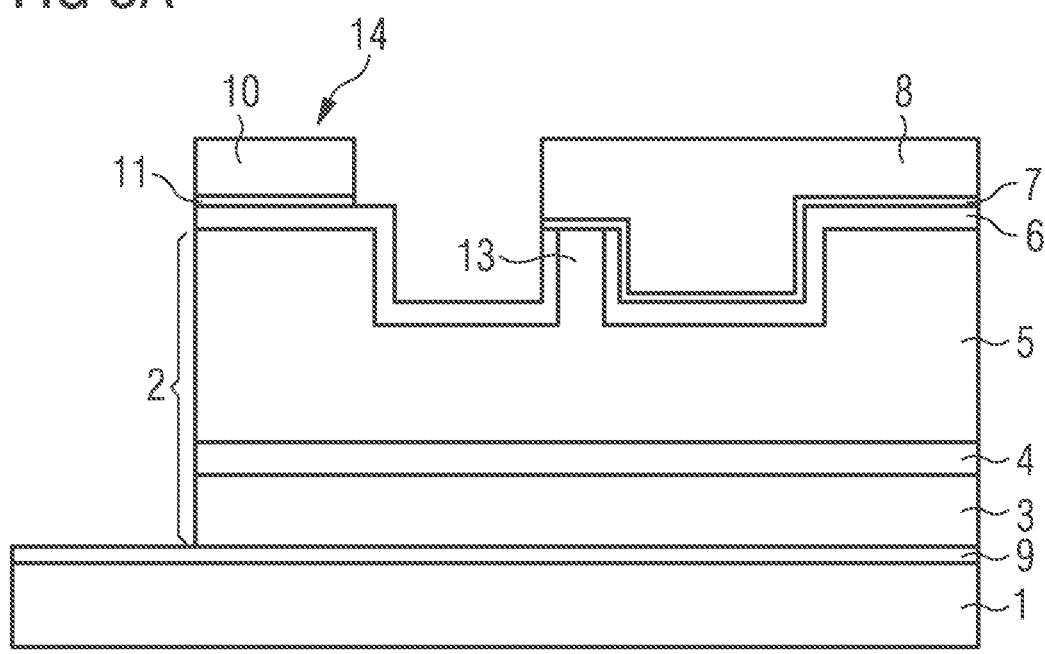
FIG. 3A shows a schematic representation of a cross-section through the laser diode chip according to a second example.
Figure 3B:
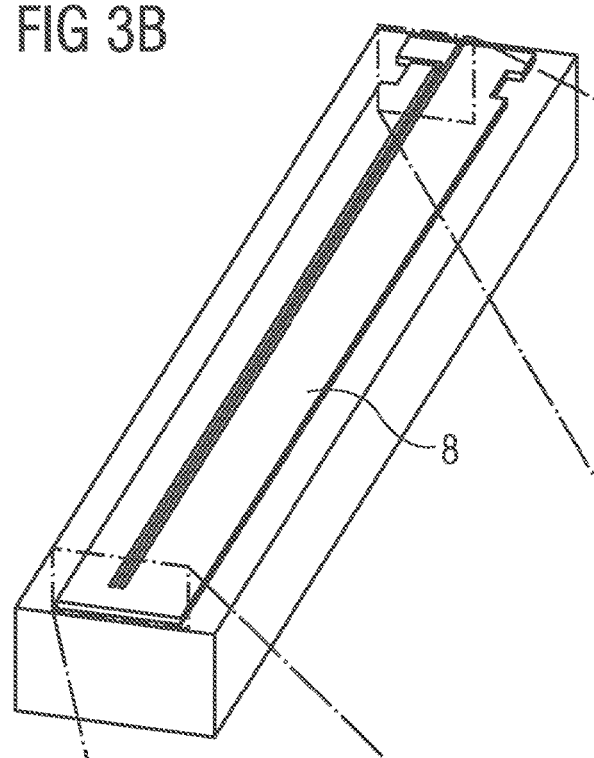
FIG. 3B shows a schematic representation of a perspective view of a laser diode chip according to the second example.
Figure 3C:
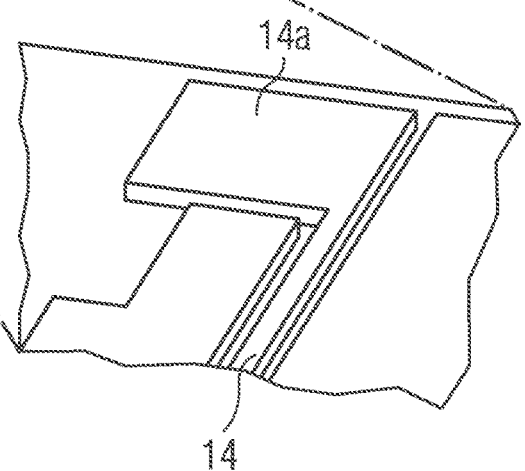
FIG. 3C shows a detailed view of the laser diode chip according to the second example.
Figure 3D:
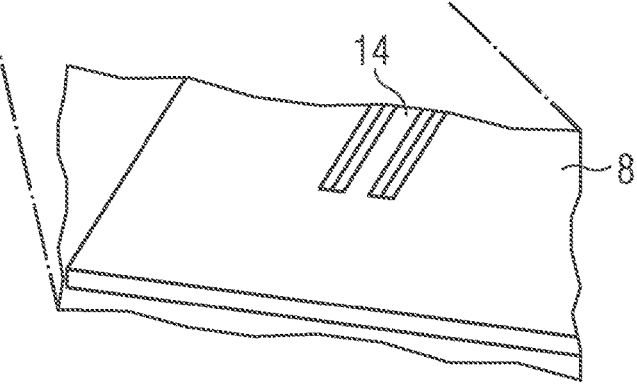
FIG. 3D shows a further detailed view of the laser diode chip according to the second example.

An exemplary embodiment of the laser diode chip in which the heating element 14 and the laser diode chip comprise a common contact is shown in FIGS. 3A to 3D. In this exemplary embodiment, the heating element 14 is a part of a metal layer 8, 10 implemented as a conductor track, which may comprise gold in particular. In this example, the metal layer 8, 10 forms both the heating element 14 and the p-contact 8. This has the advantage that no further layers need to be applied for the manufacture of the heating element 14 and thus the manufacturing effort is low. FIG. 3A shows a cross-section of the laser diode chip. FIG. 3B shows how the heating element 14 is designed as a conductor track by omitting the metal layer. The detailed view in FIG. 3C shows a contact pad 14a for the heating element 14. As can be seen in the further detailed view in FIG. 3D, one end of the conductor track forming the heating element 14 is connected to the p-contact 8.

Figure 4A:
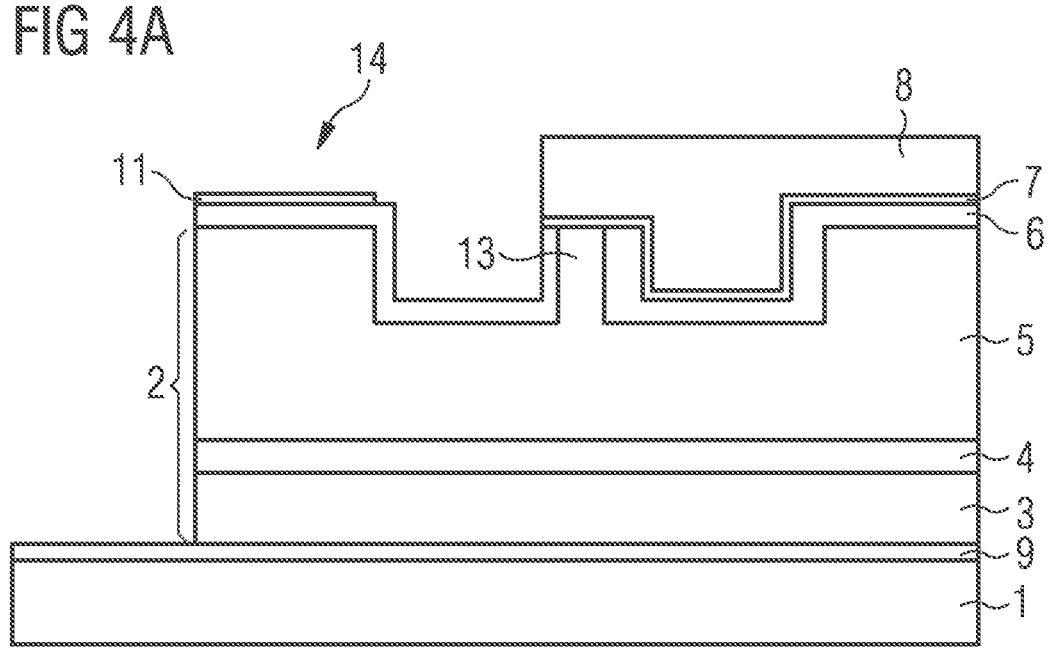
FIG. 4A shows a schematic representation of a cross-section through the laser diode chip according to a third example.

FIG. 4A shows in cross-section a variation of the previous embodiment. In this example, the heating element 14 is formed by the patterned seed layer 11. Since the seed layer 11 is thinner and comprises a higher resistivity than the metal layer forming the p-contact 8, the ohmic resistance is higher than in the example of FIG. 3, all other dimensions being equal. This allows other heating powers and/or other current/voltage operating points to be realized.

The two cross-sections shown in the examples of FIGS. 3A and 4A can also be arranged alternately parallel to the longitudinal axis of the ridge waveguide 13. Such an example is shown schematically in plan view in FIG. 4B. In this example, the cross-section along line AB corresponds to FIG. 4A and the cross-section along line CD corresponds to the example shown in FIG. 3A. In the longitudinal direction, the heating element 14 comprises alternating first regions in which only the seed layer 11 is present and second regions in which an additional metal layer 10 is applied to the seed layer 11. The metal layer 10 is, for example, a gold layer with a thickness of about 1 μm to 20 μm, in particular about 5 μm, which is preferably produced by electroplating. The metal layer 10 comprises in particular the same material as the p-contact 8 and can be manufactured and structured simultaneously with the p-contact 8. Current can flow with lower resistance through the first regions of the heating element 14 with the metal layer 10, while the resistance is higher in the second regions without a metal layer above the seed layer 11. The ratio between the first regions and the second regions is another design parameter that can be used to adjust the ohmic resistance of the heating element 14.

Figure 5:
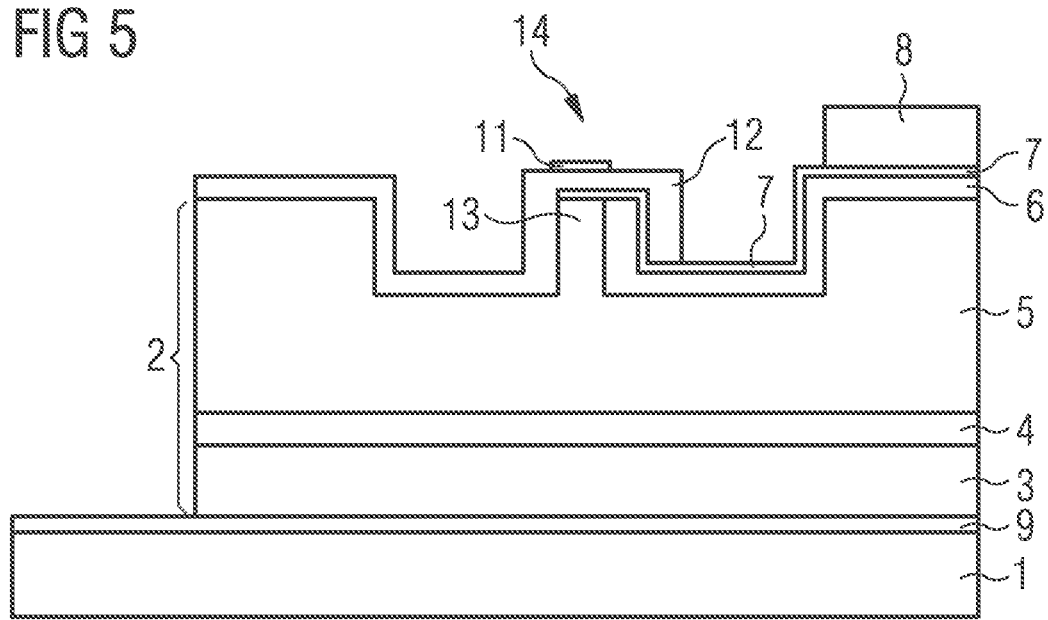
FIG. 5 shows a schematic representation of a cross-section through the laser diode chip according to a fifth example.
Figure 6:
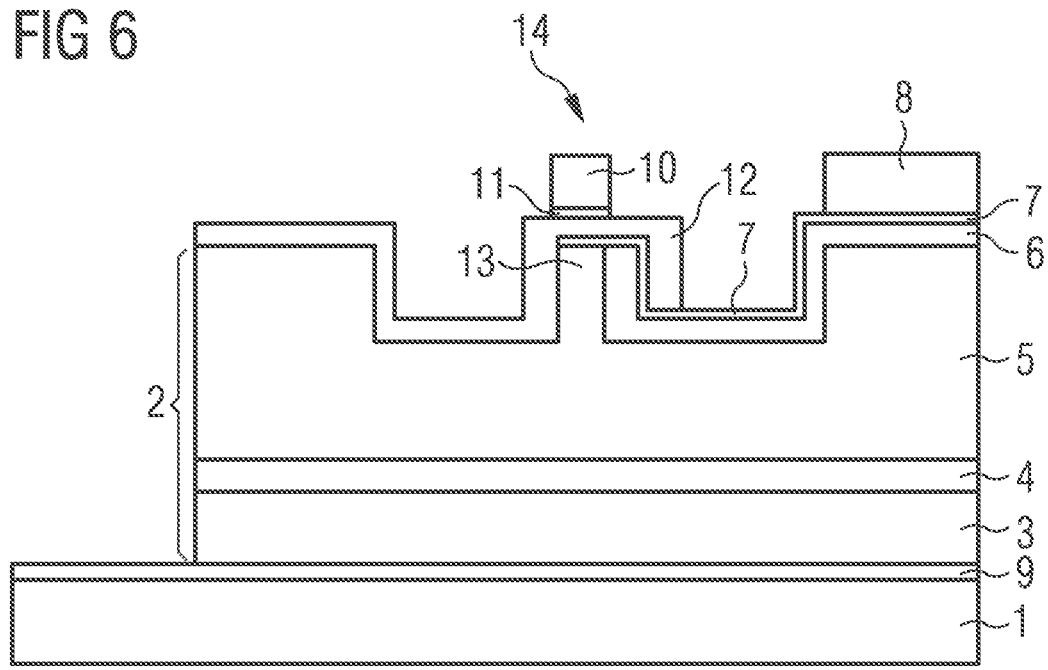
FIG. 6 shows a schematic representation of a cross-section through the laser diode chip according to a sixth example.

FIGS. 5 and 6 show further variations of the previous examples. In these examples, the heating element 14 is arranged directly above the ridge waveguide 13, but in contrast to FIG. 1 not above the p-type contact 8. The supply of the operating current for the laser diode chip takes place from the laterally arranged p-type contact 8 via the seed layer 7 to the ridge waveguide 13. The seed layer 7 is electrically insulated in regions from the p-type semiconductor region 5 by a passivation layer 6, for example a silicon oxide layer or a silicon nitride layer. A further passivation layer 12 is applied to this seed layer 7 in the region of the ridge waveguide 13 as electrical insulation. A seed layer 11 is arranged on the passivation layer 12. The seed layer 11 can comprise, for example, titanium, platinum, palladium and/or gold, and in particular the seed layer 11 can comprise a Ti—Pd—Au or Ti—Pt—Au layer sequence.

In the exemplary embodiment of FIG. 5, the seed layer 11 itself functions as the heating element 14. In this example, in particular, no further metal layer is arranged over the seed layer. The heating element is advantageously arranged above the ridge waveguide 13 so that the heating power reaches the radiation-emitting active layer particularly effectively. The heating element 14 is thus arranged close to the ridge waveguide 13 and on the side facing away from the heat sink 1. Compared with FIG. 1, there is no heat spreading due to the p-contact 8 and the associated loss of heating power. Compared to the examples of FIGS. 3 and 4, parasitic heat paths through the semiconductor material and the associated losses in heating power are dispensed with. In the exemplary embodiment of FIG. 6, the seed layer 11 with an applied metal layer 10 acts as heating element 14. The metal layer 10 is, for example, a gold layer with a thickness of about 1 μm to 20 μm, in particular about 5 μm, which is preferably produced by electroplating. The metal layer 10 comprises in particular the same material as the p-contact 8 and can be manufactured and structured simultaneously with the p-contact 8.

Figure 4B:
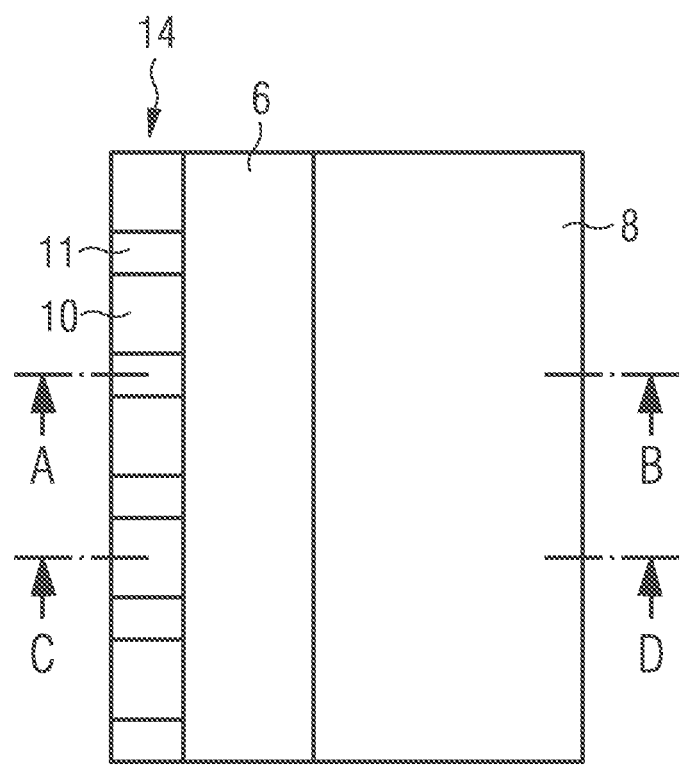
FIG. 4B shows a schematic representation of a top view of the laser diode chip according to a fourth example.

As in the previous example of FIG. 4B, an alternating arrangement in the longitudinal direction of the heating element 14 of first regions in which only the seed layer 11 is present and second regions in which a metal layer 10 is applied to the seed layer 11 is also conceivable in the examples of FIGS. 5 and 6.

Figure 7:
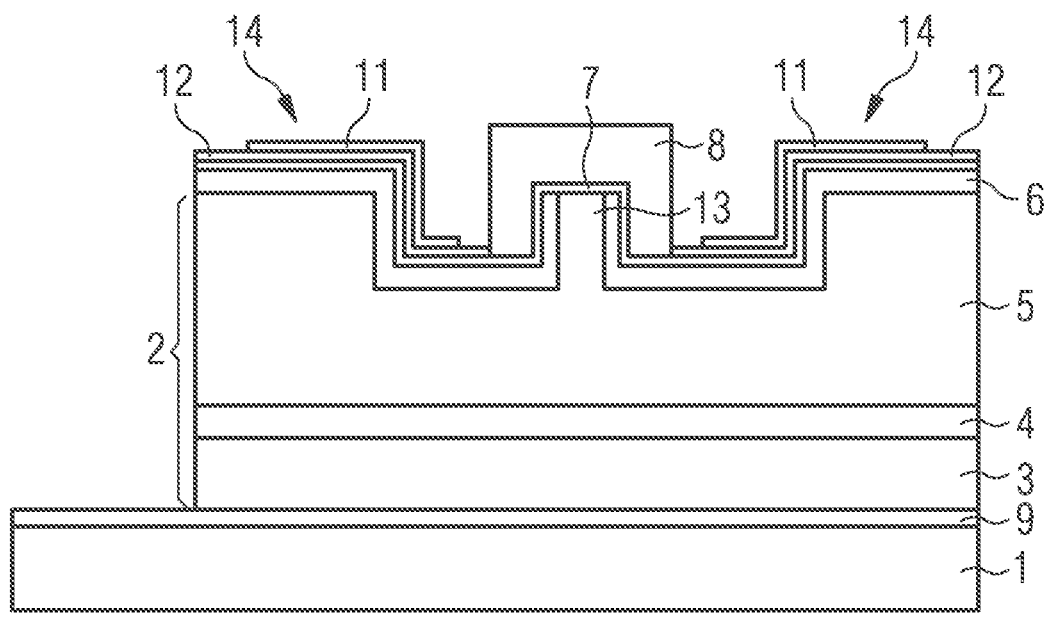
FIG. 7 shows a schematic representation of a cross-section through the laser diode chip according to a seventh example.

FIG. 7 shows another possibility of placing the heating element 14 close to the ridge waveguide 13. In this exemplary embodiment, a passivation layer 12 is applied to the seed layer 7, which serves to grow the p-contact 8. A structured conductive seed layer 11 is arranged on the passivation layer 12 as a heating element 14. The seed layer 11 is, for example, a titanium-platinum-gold layer sequence. Heating elements 14 formed in this manner extend into the recess adjacent to the ridge waveguide 13 on both sides, thus bringing the heating power closer to the ridge waveguide 13 than in the embodiment shown in FIG. 4A.

In addition, it is shown in FIG. 7 that the heating elements 14 can advantageously be mounted on both sides and symmetrically with respect to the ridge waveguide 13. The advantage is that in this way a symmetrical temperature distribution in the ridge waveguide 13 can be achieved. In this way, the beam profile or the distribution of the laser modes of the laser diode chip is prevented from becoming asymmetrical. The symmetrical arrangement of the heating elements 14 is also conceivable in the exemplary embodiments according to FIGS. 3 and 4A.

Figure 8:
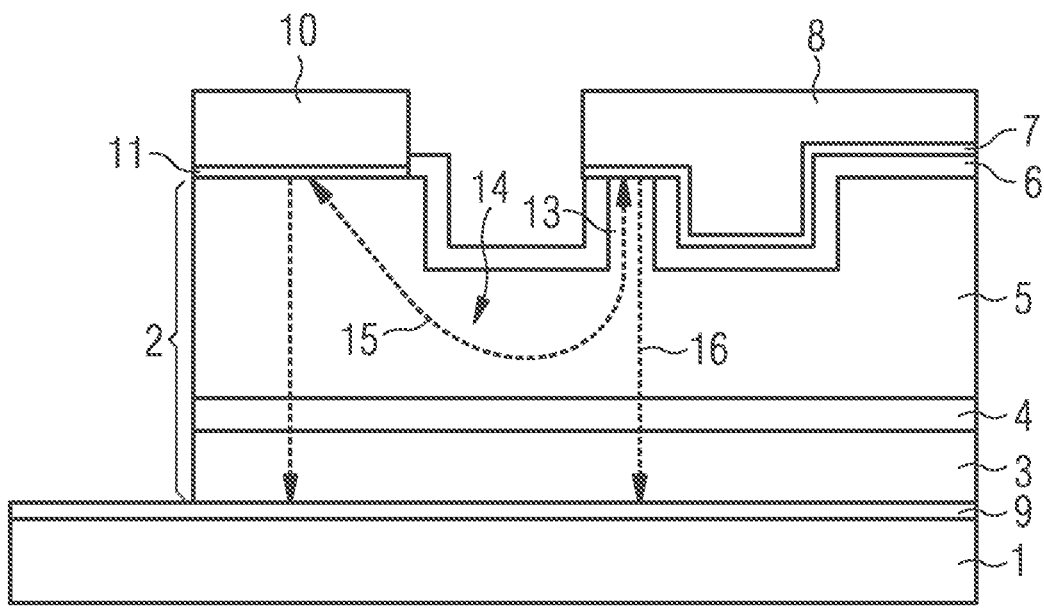
FIG. 8 shows a schematic representation of a cross-section through the laser diode chip according to an eighth example. Components that are the same or have the same effect are each given the same reference signs in the figures. The components shown, as well as the proportions of the components with respect to each other, are not to be regarded as true to scale.

FIG. 8 shows another exemplary embodiment of the laser diode chip. In this example, the heating element 14 is not a structure of the layers deposited on the semiconductor material, but the semiconductor material itself. The heating current is supplied via a heating contact, in particular a metal layer 10, and flows from there to the p-type contact 8. In this way, in addition to the current path 16 leading through the active layer 4 to the n-type contact 9, a further current path 15 is generated in the p-type semiconductor region 5, which does not lead to the n-type contact. The current flow along this current path 15 heats the semiconductor material so that the p-type semiconductor region 5 acts as a heating element. The advantage in this embodiment is, first, that the semiconductor material itself is directly heated, and second, that no fine patterning of the layers is necessary. However, in this embodiment, it should be prevented, if possible, that heating current flows on a parasitic current path to the n-contact 9. One possibility is that the heating element 14 and the laser diode chip are not operated simultaneously, as described above.

All of the previously described exemplary embodiments are characterized by the fact that the additional effort required in the manufacture of the laser diode chip is minimal, since the heating elements 14 can each be implemented with materials that are applied anyway during the manufacture of the laser diode chip. In addition, the heating elements 14 do not influence the performance data of the laser diode chip, or only to a small extent, so that the laser diode chips have no disadvantages compared to structurally identical laser diode chips without heating elements.

Due to the low mass to be heated, low heating powers are necessary to bring the active layer 4 to the target temperature and thus stabilize the wavelength. This also allows for high heating rates to achieve fast wavelength matching. Due to the low mass, faster cooling rates are also achieved when the laser diode chip is thermally connected to a heat sink 1. This allows agile control of the temperature and thus the emission wavelength.

Control of the emission wavelength can also be used to compensate for any production-related dispersion of the wavelength of multiple laser diode chips by controlling the temperature of the laser diode chip as a function of wavelength so that the laser emits at the desired wavelength.

For example, when the heating element 14 of the laser diode chip is used to control the emission wavelength, the control can be accomplished by directing at least a portion of the emitted radiation to an optical filter that comprises a transmission window at the desired emission wavelength. In other words, the optical filter is a narrow band filter that is transparent only in a narrow wavelength range around the desired emission wavelength. In this case, the heating power of the heating element can be controlled such that a detector element behind the narrowband optical filter detects a maximum intensity. When the wavelength of the emitted radiation changes, the heating power can be controlled such that the intensity detected by the detector element is maximized.

The invention is not limited by the description based on the exemplary embodiments. Rather, the invention encompasses any 10 new feature as well as any combination of features, which particularly includes any combination of features in the claims, even if this feature or combination itself is not explicitly specified in the claims or exemplary embodiments.

The invention claimed is:

1. A laser diode chip comprising:
    an n-type semiconductor region, a p-type semiconductor region, and an active layer arranged between the n-type semiconductor region and the p-type semiconductor region, an n-type contact and a p-type contact,
    at least one heating element arranged on a side of the laser diode chip facing the p-type semiconductor region, the heating element functioning as a resistance heater, and
    at least one metallic seed layer, wherein
    the heating element comprises a part of the seed layer,
    the p-type contact is arranged on a further part of the seed layer, and
    in a longitudinal direction parallel to a longitudinal axis of a waveguide of the laser diode chip, the heating element comprises alternating first regions in which only the seed layer is present and second regions in which an additional metal layer is applied directly to the seed layer, so that the first regions have a higher resistance for a current through the resistance heater than the second regions.

2. The laser diode chip according to claim 1, wherein the heating element is a conductor track.

3. The laser diode chip according to claim 1, wherein the laser diode chip is arranged on a heat sink, and wherein the active layer is arranged between the heating element and the heat sink.

4. The laser diode chip according to claim 1, wherein the heating element and the p-contact comprise the same material.

5. The laser diode chip according to claim 1, wherein the heating element comprises at least one of the metals gold, titanium, platinum or palladium.

6. The laser diode chip according to claim 1, wherein the heating element is connected to electrical contacts which are not connected to the p-contact or the n-contact of the laser diode chip.

7. The laser diode chip according to claim 1, wherein the heating element comprises a common contact with the laser diode chip.

8. The laser diode chip according to claim 1, wherein the heating element is arranged above the p-contact of the laser diode chip, wherein a first passivation layer is arranged between the heating element and the p-contact.

9. The laser diode chip according to claim 1, wherein the laser diode chip comprises a ridge waveguide, and wherein the heating element is arranged parallel to the ridge waveguide.

10. The laser diode chip according to claim 1, wherein the p-type semiconductor region is covered in regions with a second passivation layer, and wherein the heating element is arranged on the passivation layer.

11. The laser diode chip according to claim 1, wherein the heating element comprises a metal layer.

12. The laser diode chip according to claim 1, wherein a current path through the p-type semiconductor region is formed between the heating element and the p-type contact.

13. The laser diode chip according to claim 1, wherein the heating element is configured to be connected to a control device configured to control the heating power of the heating element.

14. The laser diode chip according to claim 13, wherein the control device is configured to control the heating power such that an emission wavelength is within a predetermined tolerance in a target value range.

* * * * *